United States Patent
Qiu et al.

(10) Patent No.: US 10,453,751 B2
(45) Date of Patent: Oct. 22, 2019

(54) TONE INVERSION METHOD AND STRUCTURE FOR SELECTIVE CONTACT VIA PATTERNING

(71) Applicant: GLOBALFOUNDRIES INC., Grand Cayman (KY)

(72) Inventors: Xiaofeng Qiu, Ballston Lake, NY (US); Michael V. Aquilino, Saratoga Springs, NY (US); Patrick D. Carpenter, Saratoga Spring, NY (US); Jessica Dechene, Watervliet, NY (US); Ming Hao Tang, Ballston Lake, NY (US); Haigou Huang, Rexford, NY (US); Huy Cao, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 31 days.

(21) Appl. No.: 15/432,016

(22) Filed: Feb. 14, 2017

(65) Prior Publication Data
US 2018/0261510 A1    Sep. 13, 2018

(51) Int. Cl.
| | |
|---|---|
| *H01L 29/78* | (2006.01) |
| *H01L 21/8234* | (2006.01) |
| *H01L 23/535* | (2006.01) |
| *H01L 21/768* | (2006.01) |
| *H01L 29/423* | (2006.01) |
| *H01L 27/088* | (2006.01) |
| *H01L 21/033* | (2006.01) |
| *H01L 21/311* | (2006.01) |
| *H01L 29/417* | (2006.01) |

(52) U.S. Cl.
CPC .. *H01L 21/823475* (2013.01); *H01L 21/0337* (2013.01); *H01L 21/31116* (2013.01); *H01L 21/31144* (2013.01); *H01L 21/76895* (2013.01); *H01L 23/535* (2013.01); *H01L 27/088* (2013.01); *H01L 29/41725* (2013.01); *H01L 29/4232* (2013.01); *H01L 29/42356* (2013.01); *H01L 29/78* (2013.01); *H01L 21/823468* (2013.01)

(58) Field of Classification Search
None
See application file for complete search history.

(56) References Cited

U.S. PATENT DOCUMENTS 6,468,858 B1 * 10/2002 Lou .................. H01L 28/75
257/E21.009
2007/0111539 A1 * 5/2007 Kon .................. C09D 183/04
438/778

(Continued)

*Primary Examiner* — Joseph C. Nicely
*Assistant Examiner* — Lamont B Koo
(74) *Attorney, Agent, or Firm* — Francois Pagette; Hoffman Warnick LLC

(57) ABSTRACT

A tone inversion method for integrated circuit (IC) fabrication includes providing a substrate with a layer of amorphous carbon over the substrate and a patterning layer over the amorphous carbon layer. The patterning layer is etched to define a first pattern of raised structures and a complementary recessed pattern that is filled with a layer of image reverse material. The first pattern of raised structures is then removed to define a second pattern of structures comprising the image reverse material. A selective etching step is used to transfer the second pattern into a dielectric layer disposed between the layer of amorphous carbon and the substrate.

10 Claims, 5 Drawing Sheets

(56) References Cited

U.S. PATENT DOCUMENTS

| | | | | |
|---|---|---|---|---|
| 2011/0127075 A1* | 6/2011 | Ohmi | H01L 21/0212 | 174/258 |
| 2011/0269303 A1* | 11/2011 | Marxsen | H01L 21/31144 | 438/586 |
| 2012/0211837 A1* | 8/2012 | Baars | H01L 21/823475 | 257/368 |
| 2013/0168749 A1* | 7/2013 | Fan | H01L 21/823418 | 257/288 |
| 2014/0315379 A1* | 10/2014 | He | H01L 29/78 | 438/595 |
| 2015/0255556 A1* | 9/2015 | Cheng | H01L 29/7813 | 257/332 |
| 2015/0318184 A1* | 11/2015 | Alptekin | H01L 21/31116 | 438/700 |

* cited by examiner

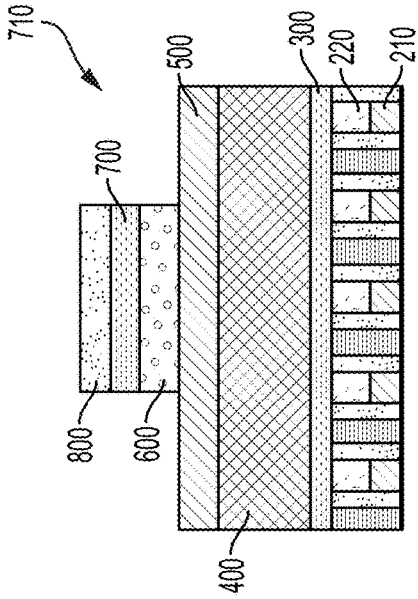
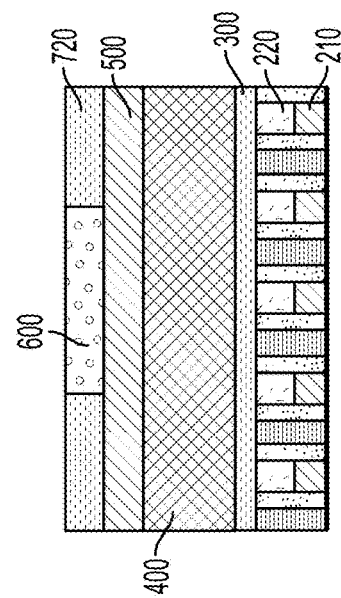
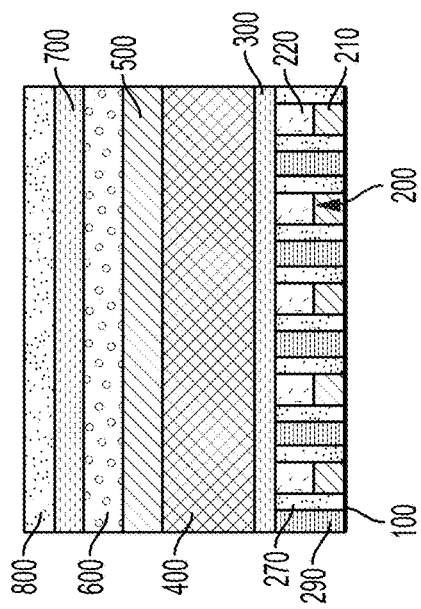
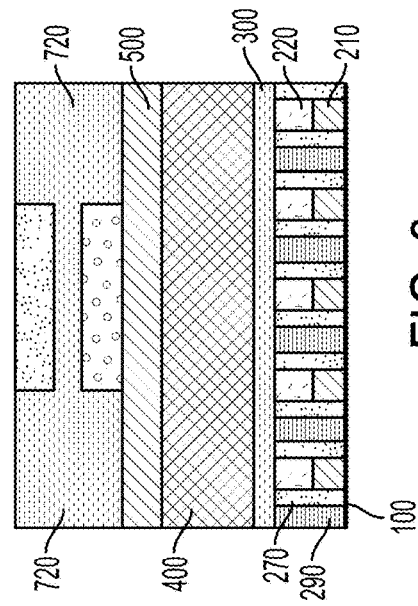
FIG. 1
FIG. 2
FIG. 3
FIG. 4

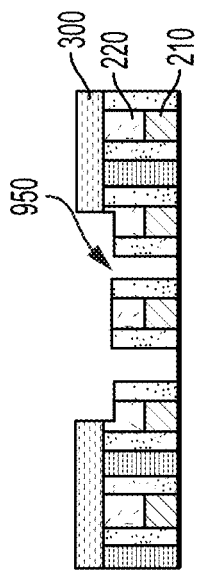
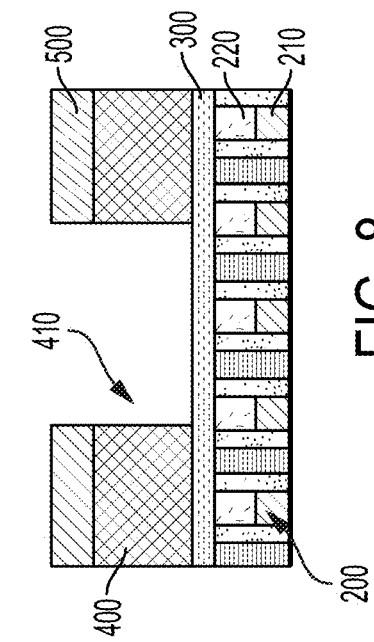
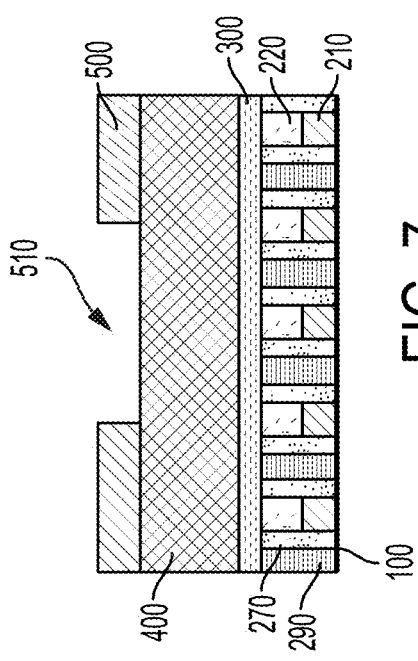
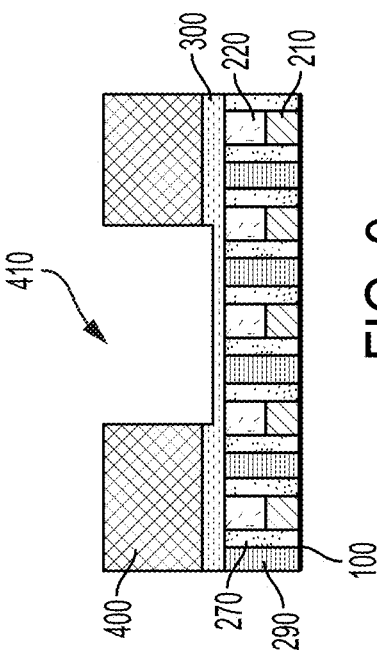

TONE INVERSION METHOD AND STRUCTURE FOR SELECTIVE CONTACT VIA PATTERNING

BACKGROUND

The present application relates generally to the field of semiconductor manufacturing, and more particularly to a method for patterning a masking layer for creating ultrafine structures.

During the fabrication of semiconductor devices, features of the device on a semiconductor substrate are commonly defined by a patterned mask. To provide increased feature density, the feature size is reduced, which may be achieved by reducing the critical dimension (CD) of the features. The foregoing requires improved patterning resolution, precision and accuracy.

SUMMARY

In order to satisfy the challenging patterning requirements of advanced process nodes, negative tone develop (NTD) and other tone inversion techniques can be used. Such techniques enable the use of bright field masks, which provide an improved lithographic process window.

Disclosed is a lithography method and accompanying structure for decreasing the critical dimension (CD) and improving the CD uniformity within semiconductor devices during the manufacturing thereof. The method provides a tone inversion of a first pattern of protruding structures, which defines a pattern of recessed features that are used to produce a second pattern of protruding structures complementary to the first pattern, i.e., located in the area complementary to the area of the first pattern. The second pattern of protruding structures defines a masking layer that cooperates with one or more etching steps to fabricate detailed nanometer-scale features.

The disclosed method advantageously decreases the number of masking layers needed to pattern the second pattern of protruding structures, which is used to reveal device-level structures such as source/drain junctions of a transistor with precise CD control.

In accordance with embodiments of the present application, a method for tone inversion for integrated circuit fabrication includes forming a plurality of gate stacks over a semiconductor substrate, forming a spacer layer over sidewalls of the gate stacks, and forming a dielectric layer over the spacer layers and between adjacent gate stacks. A patterning structure is then formed over the gate stacks, the spacer layers and the dielectric layer. The patterning structure includes, from bottom to top, an etch stop layer, an amorphous carbon layer, an adhesion layer, an amorphous silicon layer, an optional oxide layer, and a hard mask layer.

Portions of the hard mask layer, the optional oxide layer and the amorphous silicon layer are etched to form a first pattern in the amorphous silicon layer. Then, a layer of image reverse material is formed over the adhesion layer and laterally adjacent to the first pattern in the amorphous silicon layer so as to define a second pattern complementary to the first pattern. The amorphous silicon layer is removed and, using the image reverse material layer as a mask, the first pattern is etched into the dielectric layer.

A structure for tone inversion for integrated circuit fabrication includes a semiconductor substrate and a patterning structure disposed over the semiconductor substrate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 1 is a schematic diagram of a patterning structure formed over a semiconductor substrate according to various embodiments;

FIG. 2 shows the definition of trenches within plural layers of the patterning structure;

FIG. 3 depicts a post-planarization architecture following the formation of a tone inversion dielectric layer within the trenches of FIG. 2;

FIG. 4 shows the structure of FIG. 3 following a non-selective recess etch to expose the amorphous silicon layer of the patterning structure;

FIG. 7 shows the selective removal of the dielectric layer from over the adhesion layer;

FIG. 8 depicts the structure of FIG. 7 following the patterned removal of the amorphous carbon layer;

FIG. 9 shows the selective removal of the adhesion layer from over the amorphous carbon layer;

FIG. 10 shows a device architecture following selective etching of an interlayer dielectric from between adjacent gate stacks to form source/drain contact vias adjacent to a patterned etch stop layer.

DETAILED DESCRIPTION

Figure 2B:
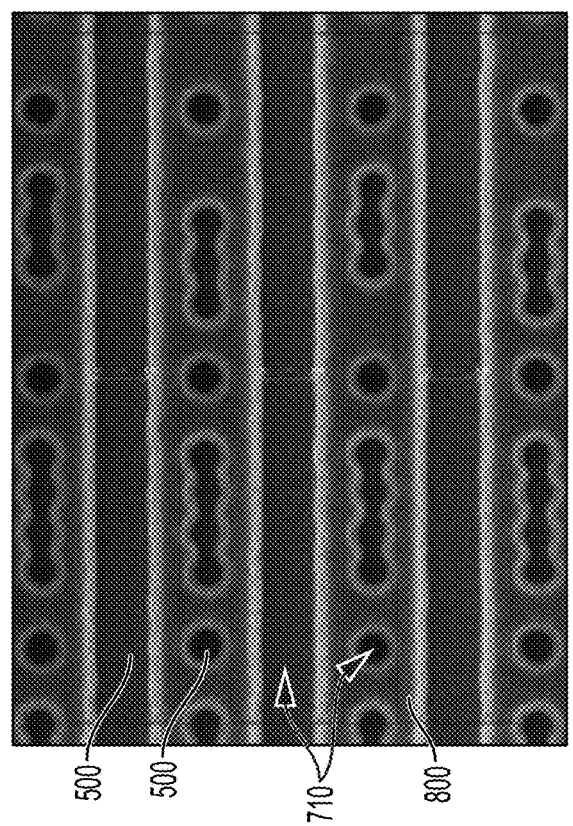
FIG. 2B is a top-down plan view SEM micrograph showing plural trenches extending through the hard mask layer, an oxide layer and an amorphous silicon layer of the patterning structure.

Reference will now be made in greater detail to various embodiments of the subject matter of the present application, some embodiments of which are illustrated in the accompanying drawings. The same reference numerals will be used throughout the drawings to refer to the same or similar parts.

Illustrated in FIG. 1 is an exemplary patterning structure for defining features in a semiconductor device using an amorphous silicon (a-Si) layer and a later-deposited dielectric layer as tone inversion layers. According to various embodiments, the patterning structure can be used to define source/drain contact vias with line-space patterns having less than a 60 nm pitch (d) and less than a 30 nm critical dimension (CD), for example. Referring to FIG. 1, the patterning structure includes a stack having, from bottom to top, an etch stop layer 300, an amorphous carbon layer 400, an adhesion layer 500, an amorphous silicon (a-Si) layer 600, an oxide layer 700, and a hard mask layer 800.

The patterning structure is formed over a semiconductor substrate 100, which may be a bulk substrate or a composite substrate such as a semiconductor-on-insulator (SOI) substrate. Disposed over the semiconductor substrate 100 and under the patterning structure are plural gate stacks 200. The gate stacks include a gate conductor 210 and a gate cap 220 disposed directly over the gate conductor 210. Sidewall spacers 270 are formed over sidewalls of the gate stacks 200, and an interlayer dielectric (ILD) material layer 290 such as an ILD oxide is disposed between adjacent gate stacks, i.e., directly between adjacent sidewall spacers 270. In various embodiments, the ILD layer 290 comprises a porous, low dielectric constant (low-k) oxide (e.g., porous $SiO_2$).

Gate conductor 210 may comprise an electrically conductive material such as polysilicon or a metal such as tungsten. The gate cap 220 may comprise a layer of nitride material such as silicon nitride. Sidewall spacers 270 may comprise a layer of a nitride material such as silicon nitride or silicon oxynitride, for example. The thickness of the sidewall spacers 270 may range from 4 to 20 nm, e.g., 4, 10, 15 or 20 nm, including ranges between any of the foregoing values. In the illustrated embodiment, respective top surfaces of the gate cap 220, sidewall spacers 270 and interlayer dielectric 290 are co-planar.

Although not shown, the semiconductor substrate 100 may include various device structures, such as the source, drain and channel regions of an exemplary transistor, and may further include isolation regions such as shallow trench isolation (STI) regions between adjacent devices, as is appreciated by one skilled in the art.

By way of example, after formation of the gate stacks 200 and sidewall spacers 270, but prior to the formation of interlayer dielectric 290, source/drain junctions may be formed in a surface of the substrate by selective epitaxy or by ion implantation at self-aligning locations with the sidewall spacers 270 between the gate stacks 200.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition. In certain embodiments, a dopant concentration within the source/drain junctions may range from $1 \times 10^{19}$ atoms/$cm^3$ to $1 \times 10^{22}$ atoms/$cm^3$, e.g., $1 \times 10^{20}$ atoms/$cm^3$ to $1 \times 10^{21}$ atoms/$cm^3$.

Disposed over the semiconductor substrate 100 and over the gate stacks 200 is the patterning structure comprising plural layers that may be formed one over the other in succession. According to various embodiments, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, and physical vapor deposition (PVD) techniques such as sputtering or evaporation.

Referring still to FIG. 1, etch stop layer 300 may comprise an oxide layer such as a layer of silicon dioxide. Etch stop layer 300 may be plasma-deposited or thermally deposited from a precursor suite comprising tetraethylorthosilicate (TEOS) and an oxygen source such as oxygen gas or ozone, or spun-on using TEOS as a precursor. The etch stop layer 300 may be formed directly over the planarized structure that includes gate stacks 200, sidewall spacers 270 and intervening interlayer dielectric layer 290. A thickness of etch stop layer 300 may range from 10 to 30 nm, e.g., 10, 20 or 30 nm, including ranges between any of the foregoing values, although greater and lesser thicknesses are contemplated.

Amorphous carbon layer 400 may be formed from a gas mixture comprising a hydrocarbon source and a diluent gas at a deposition temperature of 200° C. to 700° C. Optionally, an as-deposited amorphous carbon (a-C) layer may be cured such as by exposure to UV radiation at a curing temperature greater than 200° C. In various embodiments, the amorphous carbon layer 400 comprises a soft etching mask.

Exemplary hydrocarbon compounds that may be included in the hydrocarbon source used to form the amorphous carbon layer 400 may be described by the formula $C_xH_y$, where $1 \leq x \leq 10$ and $2 \leq y \leq 30$. Such hydrocarbon compounds may include, but are not limited to alkanes such as methane, ethane, propane, butane and its isomer isobutane, pentane and its isomers isopentane and neopentane, hexane and its isomers 2-methylpentane, 3-methylpentane, 2,3-dimethylbutane, 2,2-dimethyl butane, and the like; alkenes such as ethylene, propylene, butylene and its isomers, pentene and its isomers, and the like; dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; and alkynes such as acetylene, propyne, butyne, vinylacetylene and derivatives thereof. Further hydrocarbon compounds include aromatic molecules such as benzene, styrene, toluene, xylene, ethylbenzene, acetophenone, methyl benzoate, phenyl acetate, phenol, cresol, furan, and the like, as well as halogenated aromatic compounds including monofluorobenzene, difluorobenzenes, tetrafluorobenzenes, hexafluorobenzenes and the like.

Suitable diluent gases may include, but are not limited to, hydrogen ($H_2$), helium (He), argon (Ar), ammonia ($NH_3$), carbon monoxide (CO), carbon dioxide ($CO_2$), and mixtures thereof.

The amorphous carbon layer 400 may have a thickness of 50 to 150 nm, e.g., 50, 75, 100, 125 or 150 nm, including ranges between any of the foregoing values, although greater and lesser thicknesses may be used.

Adhesion layer 500 may comprise silicon carbon nitride (SiCN). A layer of silicon carbon nitride (SiCN) may be produced by plasma-enhanced chemical vapor deposition or microwave plasma chemical vapor deposition (MPCVD), for example, using hexamethyldisilane, $N_2$ and $H_2$ as source gases. Adhesion layer 500 is adapted to promote adhesion between the amorphous carbon layer 400 and one or more overlying layers such as amorphous silicon (a-Si) layer 600. The adhesion layer thickness may range from 15 to 40 nm, e.g., 15, 20, 25, 30, 35 or 40 nm, including ranges between any of the foregoing values.

An amorphous silicon layer 600 is formed over the adhesion layer 500. Amorphous elemental silicon can be deposited using chemical vapor deposition, such as low pressure chemical vapor deposition (LPCVD) at temperatures ranging from about 450° C. to about 700° C. Silane ($SiH_4$) can be used as the precursor for CVD silicon deposition. The amorphous silicon layer 600 may have a thickness of 20 to 50 nm, e.g., 20, 25, 30, 35, 40, 45 or 50 nm, including ranges between any of the foregoing values. As will be described in further detail below, amorphous silicon layer 600 is adapted to be patterned and serve as a sacrificial structure for the tone inversion process described herein.

Formed over the amorphous silicon (a-Si) layer 600 is an oxide layer 700. Oxide layer 700 may comprise a TEOS oxide, which may be formed using one or more of the processes described above in connection with etch stop layer 300. The oxide layer 700 may have a thickness of 20 to 50 nm, e.g., 20, 25, 30, 35, 40, 45 or 50 nm, including ranges between any of the foregoing values. In certain embodiments, oxide layer 700 may be omitted from the patterning structure.

A hard mask layer 800, such as a nitride hard mask layer, is formed over the oxide layer 700. An example hard mask layer 800 comprises silicon nitride, and may have a thickness of 20 to 50 nm, e.g., 20, 25, 30, 35, 40, 45 or 50 nm, including ranges between any of the foregoing values.

With reference to FIG. 2, a lithography etch, lithography-etch (LELE) process using two or more lithography-etch cycles (e.g., a LELELE process) is executed to form trenches 710 in the patterning structure. Using plural lithography-etch (LE) cycles enable precise dimensional control of the remaining portions of the etched layers. Formation of trenches 710 involves the removal of portions of the hard mask layer 800, oxide layer 700, and amorphous carbon layer 600 using an overlying masking structure (not shown) such that the trenches 710 are defined directly over the adhesion layer 500 and overlie areas of the underlying device architecture (e.g., ILD oxide layer 290) that are not to be etched during subsequent processing. That is, the remaining portions of the hard mask layer 800, oxide layer 700, and amorphous carbon layer 600 overlie areas of the device architecture that will be etched later in the process. In certain embodiments, the areal dimensions of the patterned structure comprising the hard mask layer 800, oxide layer 700, and amorphous carbon layer 600 may independently range from 15 to 200 nm, e.g., 15, 20, 30, 40, 50, 100, 150 or 200 nm, including ranges between any of the foregoing values.

Figure 2A:
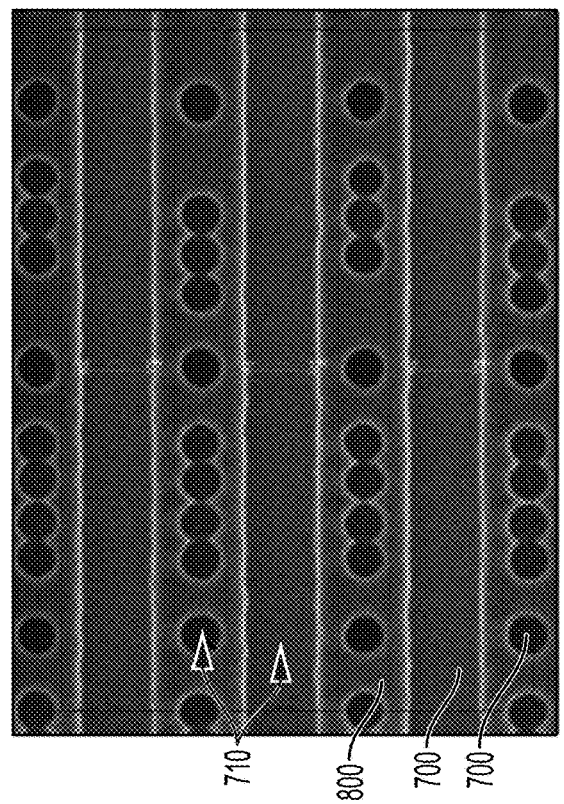
FIG. 2A is a top-down plan view scanning electron microscope (SEM) micrograph showing plural trenches extending through a hard mask layer of the patterning structure.

FIG. 2A is a top-down plan view scanning electron microscope (SEM) micrograph showing plural trenches 710 extending through hard mask layer 800 of the patterning structure. Following additional etching of the structure of FIG. 2A, a top-down plan view SEM micrograph is shown in FIG. 2B where trenches 710 extend through the hard mask layer 800, as well as the oxide layer 700 and the amorphous silicon layer 600 of the patterning structure, exposing top surfaces of adhesion layer 500. Within the patterned architecture, amorphous carbon layer 600 defines a first protruding structure. The hard mask layer 800 and the oxide layer 700 can protect the fidelity of the pattern transfer into the amorphous carbon layer 600 by minimizing gauging of the amorphous carbon layer 600 during etching and/or scratching of the amorphous carbon layer 600 during polishing.

Referring to FIG. 3, a dielectric layer 720 (i.e., image reversal material layer) is deposited up to the patterned hard mask layer 800 to fill the trenches 710. In various embodiments, dielectric layer 720 is an oxide layer such as a TEOS oxide layer, which may be formed using one or more of the processes described above in connection with etch stop layer 300. Alternatively, an atomic layer deposition (ALD) process may be used to form dielectric layer 720.

Once the trenches 710 have been filled, the dielectric layer 720 is polished to remove the overburden and planarize the structure. For instance, grinding or chemical mechanical polishing (CMP) may be used to planarize the structure, as illustrated in FIG. 3. Chemical mechanical polishing (CMP) is a material removal process that uses both chemical reactions and mechanical forces to remove material and planarize a surface. The hard mask 800 may function as a CMP etch stop.

Then, referring to FIG. 4, according to various embodiments, a non-selective reactive ion etch is used to remove the hard mask 800, oxide layer 700, and portions of the dielectric layer 720 above a top surface of the amorphous silicon layer 600. As used herein, a "non-selective etch" can be used to remove oxide and nitride materials at comparable etch rates. Such a process can be end-pointed using a signal attributable to the amorphous silicon layer 600, and can create a structure where a top surface of the amorphous silicon layer 600 is co-planar with a top surface of the dielectric layer 720.

Thereafter, beginning with an etch of the patterned amorphous silicon layer 600, a series of etch steps are used to yield a desired masking structure over the substrate, such as a source/drain contact pattern over source/drain junctions. The pattern may be initially defined by dielectric layer 720, and then transferred to underlying layers of the patterning structure and ultimately to the ILD oxide 290.

As used herein, various pattern transfer etching processes comprise an anisotropic etch. In embodiments, a dry etching process such as, for example, reactive ion etching can be used. In other embodiments, a wet chemical etchant can be used. In still further embodiments, a combination of dry etching and wet etching can be used.

In addition to the directional nature of an etch process, a factor associated with etching is etch selectivity. Etch selectivity refers to the ratio of etch rates of two different materials undergoing etching. In various scenarios, it is desired that a first material be etched faster than a second material.

A plasma reactor may be used to perform various etch processes. In such processes, a substrate is placed inside a vacuum chamber of the reactor and process gases, including etchant gases, are introduced into the chamber. The gases are energized to ignite and maintain a plasma. Depending upon the composition of the gases from which the plasma is formed, the plasma may be used to etch a particular material from the substrate. Selective etching processes have also been developed that depend more upon chemical effects. These processes are often described as reactive ion etching (RIE).

Plasma can be produced in various types of plasma reactors. Such plasma reactors typically have energy sources which use RF energy, microwave energy, magnetic fields, etc. to produce a medium to high density plasma. During one or more of the disclosed etch processes, including the selective etch of the ILD oxide layer 290, the plasma generated may comprise any plasma capable of being produced in a vacuum chamber, for example, by providing a grounded electrode and a second electrode connected to a source of RF power.

Figure 6:
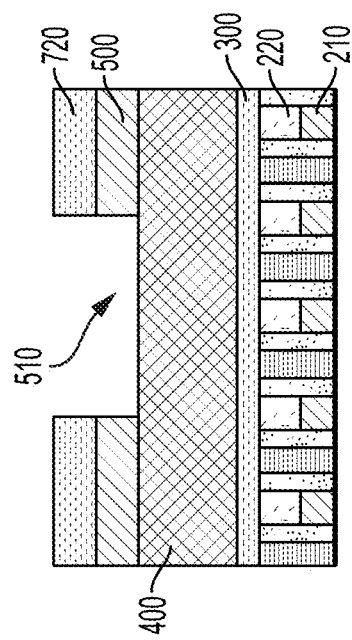
FIG. 6 depicts patterning of the adhesion layer coincident with the patterned dielectric layer of FIG. 5 and the exposure of an amorphous carbon layer.
Figure 5:
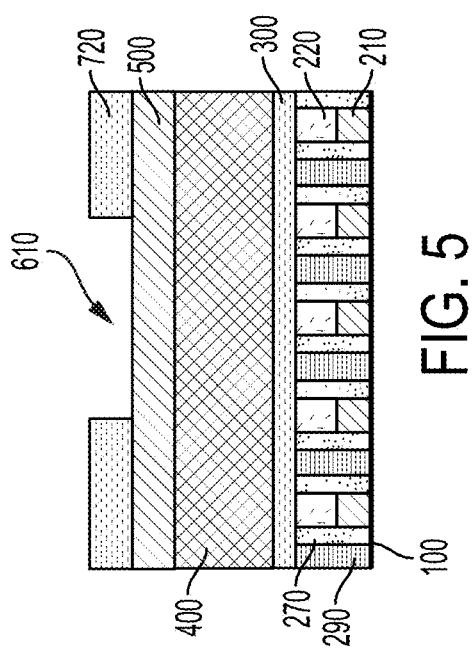
FIG. 5 shows the selective removal of the amorphous silicon layer and the simultaneous formation of a pattern of protruding structures complementary to the amorphous silicon layer.

As shown in FIGS. 5 and 6, one or more etch processes selective to the dielectric layer 720 and the amorphous carbon layer 400 can be performed. These processes include etching (i.e., removing) the patterned amorphous silicon layer 600 to form trench 610, and etching the adhesion layer 500 exposed within the trench 610, i.e., with dielectric layer 720 acting as a mask, to form trench 510.

An example etching gas for etching the amorphous silicon layer 600 and the silicon carbon nitride adhesion layer 500 includes a hydrocarbon or halogen-containing fluorocarbon gas, an oxygen-containing gas, and an optional carrier gas. The hydrocarbon or halogen-containing gas can be at least one of HBr, HCl, $Cl_2$, $CH_3F$, $CH_2F_2$, $CHF_3$ and $C_2H_4F_6$, the oxygen-containing gas may be $O_2$, CO, or $CO_2$, and the carrier gas may be He, Ne, Ar, Kr, or Xe. A exemplary halogen-containing gas is $CH_3F$ and an exemplary oxygen containing gas is $O_2$, which can be delivered to the chamber at a $CH_3F:O_2$ flow rate ratio ranging from 1:1 to 1:4.

Figure 5A:
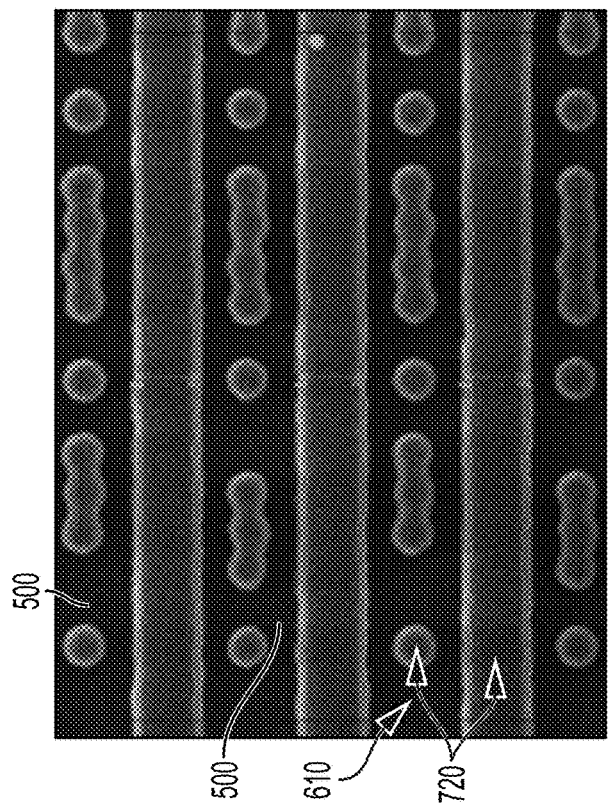
FIG. 5A is a top-down plan view SEM micrograph showing a patterned dielectric layer defining a pattern of protruding structures, and adjacent trenches exposing a top surface of the adhesion layer.

FIG. 5A is a top-down plan view SEM micrograph showing trenches 610 extending into the dielectric layer 720 and exposing a top surface of the adhesion layer 500. In FIG. 5A, the patterned dielectric layer 720 comprises a second pattern of protruding structures, which defines a pattern that is complementary to the first pattern of protruding structures.

At this stage of fabrication, the remaining dielectric layer 720 can be removed from over the patterned adhesion layer 500, as shown in FIG. 7. For instance, a dilute aqueous solution of hydrofluoric acid (HF) optionally buffered with ammonium fluoride may be used as a silicon dioxide wet etch followed by a rinse.

Referring to FIG. 8, the patterned adhesion layer 500 serves as an etch mask for the subsequent removal of unmasked portions of the amorphous carbon layer 400 to form trench 410. In certain embodiments, removal of the amorphous carbon layer 400 is selective to etch stop layer 300, which may forestall etching of the ILD oxide 290 during etching of the amorphous carbon layer 400.

Exposed portions of the amorphous carbon layer 400 may be removed by etching with a plasma comprising oxygen. An example plasma includes oxygen, hydrogen, and fluorine-containing gas such as $NF_3$, $SF_6$, $CF_4$, or combinations thereof. Optionally, the plasma may further comprise HBr, $N_2$, He, Ar, or combinations thereof.

Referring to FIG. 9, remaining portions of the adhesion layer 500 can be removed from over the amorphous carbon layer 400. In various embodiments, the nitride adhesion layer 500 is removed prior to etching through etch stop layer 300 and into exposed portions of the ILD oxide 290. Removal of the adhesion layer prior to exposing gate caps 220 and sidewall spacers 270 facilitates later removal of the amorphous carbon layer 400 without damaging the nitride layers 220, 270.

Referring to FIG. 10, exposed portions of the etch stop layer 300 and the ILD oxide 290 are etched selectively with respect to the gate cap 220 and the sidewall spacers 270 to form self-aligned source/drain contact vias 950 and expose source/drain junctions between adjacent gate stacks 200. A plasma etch such as a reactive ion etch can be used to remove the etch stop layer 300 and the ILD oxide 290 that are exposed within trench 410. Perfluorocarbon (PFC) and hydrofluorocarbon (HFC) compounds such as $CF_4$, $CHF_3$, $C_2F_6$, $C_3F_8$, $C_4F_6$ and $C_4F_8$ may be used as etching agents in order to selectively etch $SiO_2$ relative to silicon, polysilicon, a low k spacer and/or silicon nitride.

According to various embodiments, the amorphous carbon layer 400 contributes to the etch selectivity of the ILD oxide 290 with respect to the nitride gate cap 220 and nitride sidewall spacers 270. Without wishing to be bound by theory, when a fluorine-containing hydrocarbon such as $C_4F_6$ is used as an etchant, fluorocarbon radicals are created in the plasma and form a passivation layer of a carbon and fluorine-containing polymer that deposits on the material layers being etched, e.g., exposed oxide and nitride surfaces. However, the polymer is dissociated by oxygen-containing species that are formed during etching of the exposed ILD oxide 290. Thus, the polymer is deposited preferentially over the nitride layers 220, 270 with respect to oxide layer and decreases the nitride etch rate.

By incorporating a carbon source (i.e., a soft mask such as amorphous carbon layer 400) in the patterning structure proximate to the oxide and nitride layers, the ILD oxide will be etched while the nitride layers will etch at a substantially slower rate due to the formation thereon of a passivating polymer coating. For instance, the etch selectivity may range from 2:1 to 20:1, e.g., 2:1, 4:1, 10:1, 15:1 or 20:1, including ranges between any of the foregoing values.

Further to its function as a source of gas phase carbon, after it is used as a masking layer, the amorphous carbon layer 400 can be removed, such as by plasma ashing. For instance, the amorphous carbon layer 400 may be removed with a plasma comprising ozone, oxygen, ammonia, hydrogen, or combinations thereof.

Figure 10A:
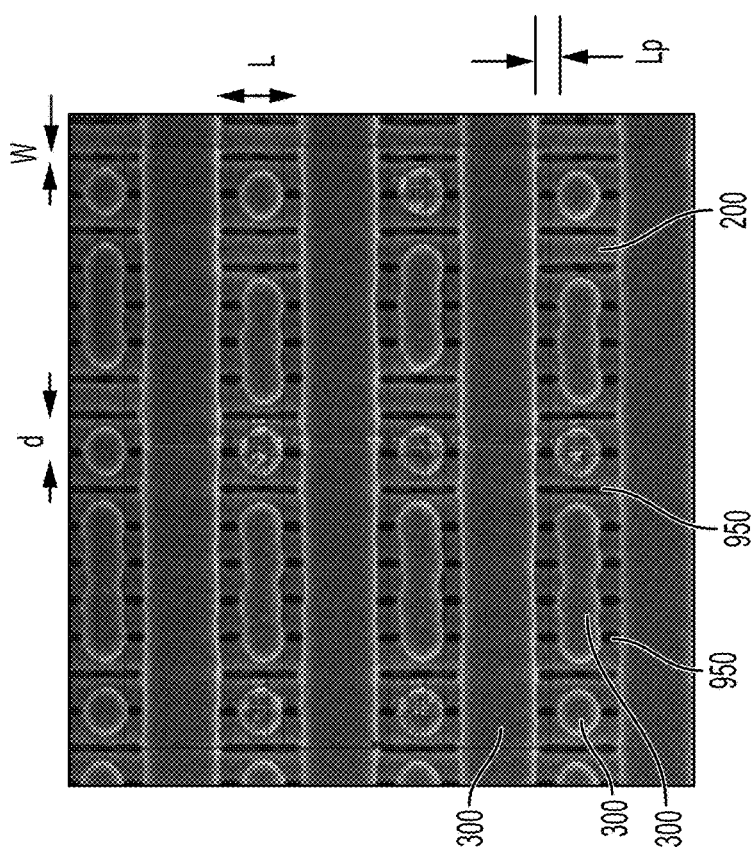
FIG. 10A is a top-down plan view SEM micrograph showing open source/drain contact vias adjacent to the patterned etch stop layer.

FIG. 10A is a top-down plan view SEM micrograph showing open source/drain contact vias 950 and a patterned etch stop layer 300. In the illustrated embodiment, the source/drain contact vias 950 have a length (L) and a width (W). The length (L) extending between adjacent regions of etch stop layer 300 may range from 50 to 150 nm, e.g., 50, 100 or 150 nm, including ranges between any of the foregoing values. The width (W) of the source/drain contact vias 950, i.e., between adjacent sidewall spacers 270, may range from 4 to 20 nm, e.g., 4, 6, 8, 10, 15 or 20 nm, including ranges between any of the foregoing values.

The source/drain contact vias 950 may also be characterized by a patterned length ($L_p$). The patterned length ($L_p$) may range from 15 to 30 nm, e.g., 15, 20, 25, 30, 35 or 40 nm, including ranges between any of the foregoing values, and is defined by un-etched portions of etch stop layer 300.

Referring to FIGS. 10 and 10A, it will be appreciated that patterned portions of the etch stop layer 300 are arranged to overlie and therefore mask portions of the ILD oxide layer 290, such that during selective etching of the ILD oxide layer 290, source/drain contact vias 950 are formed having a critical dimension, i.e., patterned length ($L_p$), of 30 nm or less.

In various embodiments, the plasma process used to etch the ILD oxide layer 290 and form contact vias 950 uses a high density plasma. As used herein, "high density" plasma is plasma generated by an electromagnetically coupled plasma generator. The term "electromagnetically coupled plasma generator" refers to any type of plasma generator that uses an electromagnetic field, rather than a capacitively-coupled generator to produce the plasma. Such electromagnetically-coupled plasma generators can create plasma having an ion density of greater than $10^{10}$ ions/cm$^3$, which is a characteristic of "high density" plasma. Example electromagnetically-coupled plasma generators include an electron cyclotron resonance (ECR) type plasma generator, and an inductively-coupled helical or cylindrical resonator.

In certain embodiments, the source power of such high density plasma may range from 500 Watts to 5 kiloWatts (kW), depending upon the particular type of plasma generator, chamber size, desired etch rate, etc. RF bias power, for example, is typically applied to the electrode on which the substrate resides, while the chamber wall or another electrode is used as ground.

The disclosed self-aligned contact method uses a selective etch in conjunction with a tone inversion patterning platform to define vias, e.g., source/drain contact vias, with a high degree of accuracy and precision. While described in the context of self-aligned source/drain contacts, the foregoing method may be integrated with any appropriate via process scheme to form conductive contacts or interconnects.

As used herein, the singular forms "a," "an" and "the" include plural referents unless the context clearly dictates otherwise. Thus, for example, reference to a "device" includes examples having two or more such "devices" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a layer that comprises amorphous carbon include embodiments where the layer consists essentially of amorphous carbon and embodiments where the layer c consists of amorphous carbon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method for tone inversion for integrated circuit fabrication, the method comprising:
   forming a plurality of gate stacks over a semiconductor substrate;
   forming a spacer layer over sidewalls of the gate stacks;
   forming a dielectric layer over the spacer layer and between adjacent gate stacks of the plurality of gate stacks;
   forming a patterning structure over the plurality of gate stacks, the spacer layer and the dielectric layer, the patterning structure comprising, from bottom to top, an etch stop layer, an amorphous carbon layer, an adhesion layer, an amorphous silicon layer, an optional oxide layer, and a hard mask layer;
   etching the hard mask layer, the optional oxide layer and the amorphous silicon layer to form a first pattern in the amorphous silicon layer;
   forming a layer of image reverse material over the adhesion layer and laterally adjacent to the first pattern in the amorphous silicon layer, wherein the layer of image reverse material defines a second pattern complementary to the first pattern;
   removing the amorphous silicon layer; and
   using the image reverse material layer as a mask, etching the first pattern into the dielectric layer, wherein during etching of the dielectric layer a passivation layer comprising carbon from the amorphous carbon layer is deposited directly over the gate stacks and the spacer layers.

2. The method of claim 1, wherein the etch stop layer comprises silicon dioxide.

3. The method of claim 1, wherein the adhesion layer comprises SiCN.

4. The method of claim 1, wherein the hard mask layer comprises silicon nitride.

5. The method of claim 1, wherein the dielectric layer is etched selective to the spacer layer and the gate stack.

6. The method of claim 1, wherein the dielectric layer comprises silicon dioxide and the spacer layer comprises silicon nitride.

7. The method of claim 1, wherein the amorphous carbon layer thickness is 50 to 150 nm.

8. The method of claim 1, wherein the gate stacks are arranged at a pitch of less than 60 nm.

9. The method of claim 1, wherein the first pattern includes a critical dimension of less than 30 nm.

10. The method of claim 1, wherein the first pattern etched into the dielectric layer comprises a source/drain contact via.

* * * * *